United States Patent
Grivna

(10) Patent No.: US 7,087,925 B2
(45) Date of Patent: Aug. 8, 2006

(54) SEMICONDUCTOR DEVICE HAVING REDUCED CAPACITANCE TO SUBSTRATE AND METHOD

(75) Inventor: Gordon M. Grivna, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/773,853

(22) Filed: Feb. 9, 2004

(65) Prior Publication Data

US 2005/0173777 A1    Aug. 11, 2005

(51) Int. Cl.
*H01L 29/00* (2006.01)
(52) U.S. Cl. ............... 257/34; 438/42; 438/337; 438/345
(58) Field of Classification Search ........ 257/290–310; 438/399, 207, 218, 219, 34, 42, 337, 345
See application file for complete search history.

(56) References Cited

U.S. PATENT DOCUMENTS

| | | | |
|---|---|---|---|
| 5,742,091 A | 4/1998 | Hebert | |
| 5,844,299 A | 12/1998 | Merrill et al. | |
| 6,034,389 A * | 3/2000 | Burns et al. | 257/301 |
| 6,180,995 B1 | 1/2001 | Hebert | |
| 6,221,727 B1 | 4/2001 | Chan et al. | |
| 6,307,247 B1 | 10/2001 | Davies | |
| 6,661,068 B1 | 12/2003 | Durham et al. | |
| 6,821,840 B1 * | 11/2004 | Wieczorek et al. | 438/240 |
| 2003/0146490 A1 | 8/2003 | Averett et al. | |

\* cited by examiner

*Primary Examiner*—Fetsum Abraham
(74) *Attorney, Agent, or Firm*—Kevin B. Jackson

(57) ABSTRACT

In one embodiment, a matrix of free-standing semiconductor shapes are oxidized to form a low capacitance isolation tub. The adjacent rows of shapes in the matrix are offset with respect to each to minimize air gap and void formation during tub formation. In a further embodiment, the spacing between adjacent rows is less than the spacing between shapes within a row.

11 Claims, 5 Drawing Sheets

SEMICONDUCTOR DEVICE HAVING REDUCED CAPACITANCE TO SUBSTRATE AND METHOD

BACKGROUND OF THE INVENTION

This invention relates generally to semiconductor devices, and more specifically to integrated circuit devices having regions of low capacitance.

Semiconductor device technology continues to scale transistors to smaller and smaller dimensions to provide increased functionality and improved high frequency performance. By way of example, wireless communication devices often use integrated circuits that include high-density digital signal processing functions on a single chip together with analog circuits operating at frequencies greater than five gigahertz (GHz).

Although transistor devices are more easily scalable, other integrated circuit components are not as readily scalable. Such components include passive devices that often have relatively high parasitic substrate capacitances, which can limit the overall frequency performance of an integrated circuit. Inductors are an example of passive components that are not easily reduced in size without reducing their quality factor (Q) or inductance to unacceptable levels. Additionally, bonding pads are not readily scalable because manufacturers must attach bonding wires to the bonding pads.

Semiconductor manufacturers have attempted several techniques to reduce parasitic capacitance effects associated with passive components. One such technique is to form the passive components over a low permittivity material. However, such materials in use today are limited by film thickness, which is often too thin to provide a sufficient reduction in capacitance, or cost with materials such as silicon on insulator. Another approach is to form the passive components over a thick dielectric film that includes air gaps or voids that reduce the overall permittivity of the dielectric film. However, such films have been found to produce significant stresses on semiconductor devices, which degrade device performance and reliability. Also, the air gaps act as sources of contamination because they trap moisture and other chemicals during wafer processing. The trapped contaminants then outgas during later processing and impact device yields and reliability. Other approaches reduce the stress by producing fewer voids or voids with limited volume, which has a correspondingly limited effect on parasitic capacitance.

Accordingly, a need exists for a low capacitance structure and method of a making a semiconductor device that maintains a low cost while reducing die stresses. It would be a further advantage for such structures and methods to avoid air gaps and their associated contamination problems. It would be a still further advantage for such structures and methods to be easily integrated into standard integrated circuit process flows.

DETAILED DESCRIPTION OF THE DRAWINGS

Figure 1:
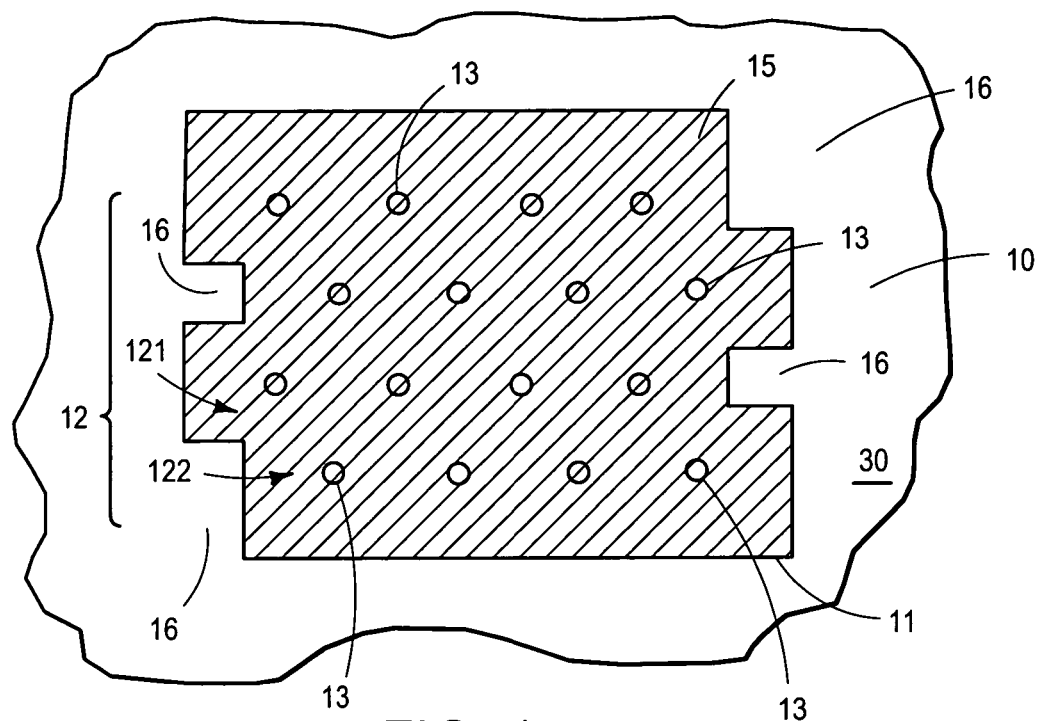
FIG. 1 illustrates a top view of an embodiment of a reduced capacitance region according to the present invention.

For ease of understanding, elements in the drawing figures are not necessarily drawn to scale, and like element numbers are used where appropriate throughout the various figures.

FIG. 1 shows a top view of an isolation, dielectric, or low capacitance region or tub 10 at a later stage or step of fabrication as part of a region of semiconductor material or semiconductor layer or region 30. Region 10 comprises a substantially or nearly continuous tub of dielectric material 15. Region 10 includes a perimeter 11 that defines a boundary, perimeter, or edge shape of region 10. Region 10 further includes a matrix or plurality 12 of semiconductor protrusions, shapes, pillars, pillar regions, pillars of semiconductor material, or posts 13 within boundary perimeter 11, which are surrounded by isolation or dielectric material 15.

To minimize void or air gap formation and high stresses during a thermal oxidation or dielectric growth step, shapes 13 are formed so that adjacent rows of shapes 13 are offset with respect to each other. As shown in FIG. 1, row 122 is offset with respect to row 121. Preferably, boundary 11 follows the row alignment of matrix 12 as shown in FIG. 1. In one embodiment, boundary 11 includes recessed portions 16 that keep boundary 11 substantially equidistant from shapes 13. In one embodiment, the distance (shown as dimension 17 in FIG. 2) between shapes 13 within row 122 is greater than the distance (shown as dimension 18 in FIG. 2) between shapes 13 in row 121 and shapes 13 in row 122. These features are important to minimize any air gap or void formation during subsequent processing, which have been shown to cause significant problems in prior art structures. These features also provide for a dielectric formation step that is nearly self-limiting and self-planarizing, which among other things, reduce stress.

Figure 2:
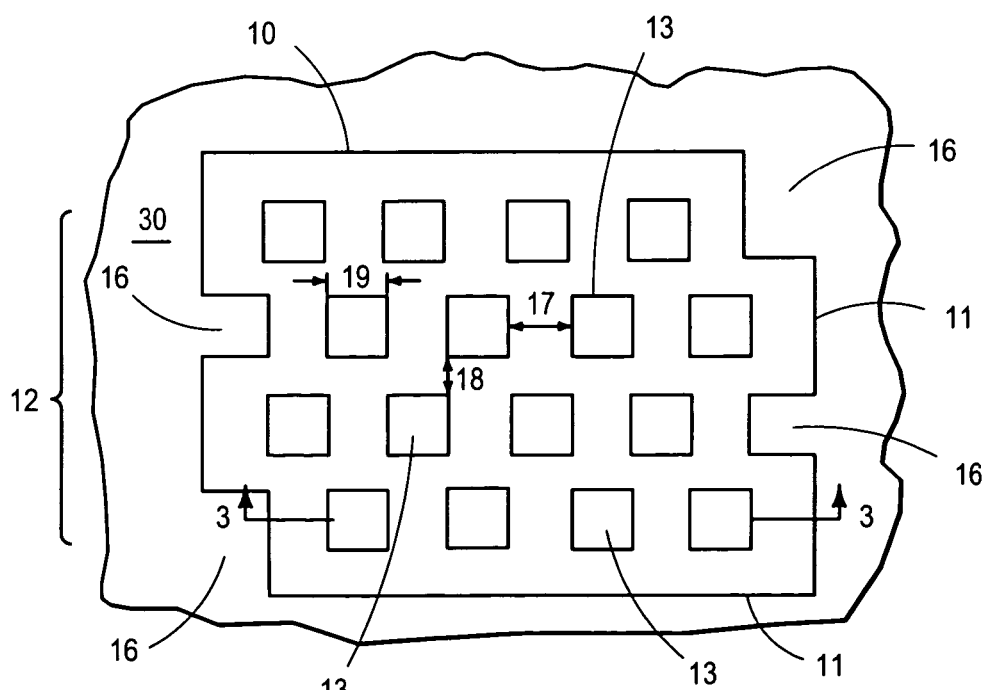
FIG. 2 illustrates a top view of the reduced capacitance region of FIG. 1 and an intermediate stage of fabrication.

FIG. 2 shows dielectric tub 10 at an earlier stage of manufacture. In this embodiment, shapes 13 are square or square-like, and have, for example, a width 19 of approximately 0.8 micrometers. Preferably, shapes 13 are spaced a distance 17 and 18 of approximately 0.4 to 0.8 micrometers apart. Distances 17 and 18 are adjusted depending upon the length and width of shapes 13 so that predominately all or substantially all of the material that shapes 13 are comprised of is consumed or converted to dielectric material 15 during subsequent processing as shown in FIG. 1.

For example, when dielectric material 15 comprises a thermal oxide and shapes 13 comprise silicon, distances 17 and 18 and width 19 are adjusted based on the relationship that about 44% of a silicon dioxide thickness corresponds to the amount of silicon consumed during oxide growth. In one embodiment, when shapes 13 are 0.8 microns by 0.8 microns square and approximately 6 microns in height (distance 23 shown in FIG. 3), distance 17 is about 0.8 microns, and distance 18 is about 0.6 microns. These dimensions result in a self-limiting process where all or substantially all of shapes 13 are converted to silicon dioxide. This was found to reduce stress and air gap formation, which improves reliability and device performance.

Although shapes 13 are shown square in FIG. 2, shapes 13 alternatively comprise rectangular, circular, oval, elliptical, triangular, or combinations thereof. When square or rectangular, shapes 13 may have rounded corners. Alternatively, shapes 13 are dumb-bell shapes or polygon shapes.

Figure 3:
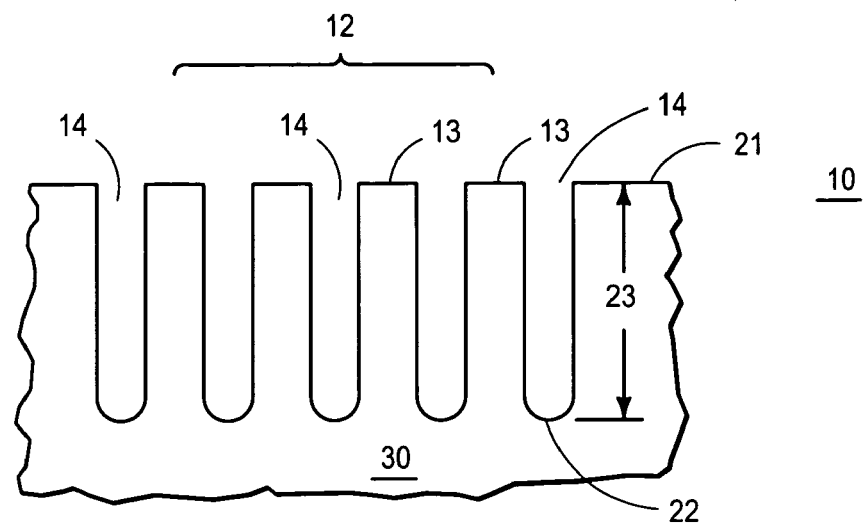
FIG. 3 illustrates a partial cross-sectional view of the device of FIG. 2 taken along reference line 3—3.

FIG. 3 shows dielectric tub 10 taken along reference line 3—3 in FIG. 2 to show shapes 13 in cross-sectional form as part of semiconductor layer or region 30. As shown, each shape 13 is free-standing, and has a trench or gap portion 14 adjacent thereto. In one embodiment, shapes 13 have a height 23 from a major surface 21 of semiconductor region 30 to lower or second surface 22 of gap portion 14 of approximately 4 to 8 micrometers. Region 30 comprises, for example, silicon, a IV—IV compound semiconductor material, a III–V compound semiconductor material, or the like.

Figure 4:
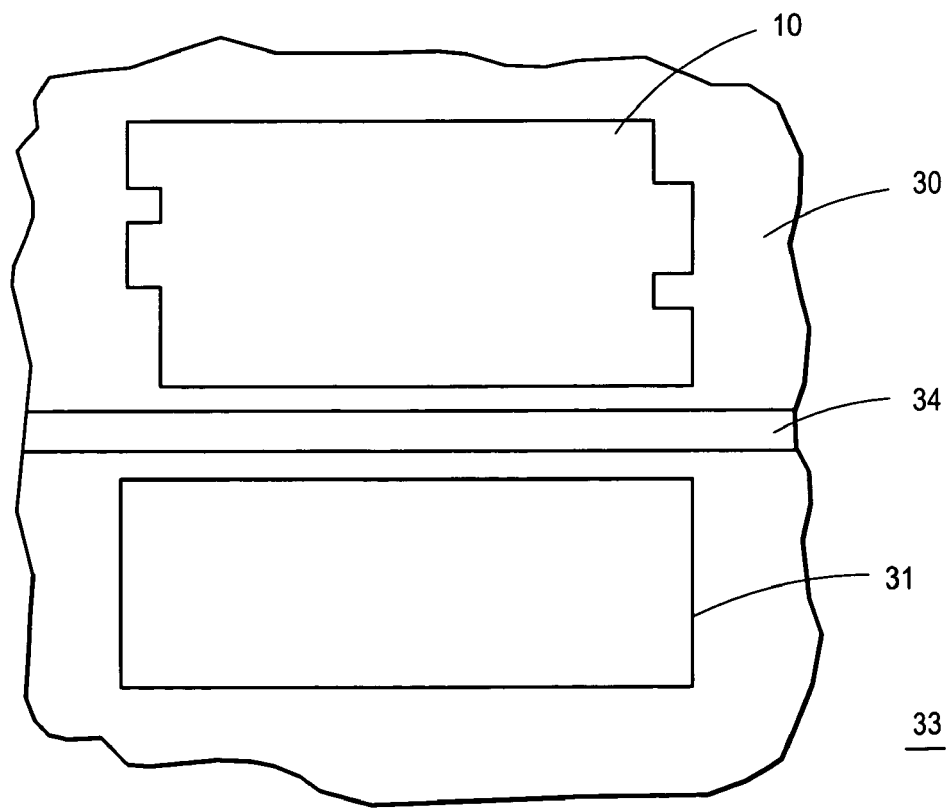
FIG. 4 illustrates a partial top view of a semiconductor device including a reduced capacitance region and an active region.

FIG. 4 shows a partial top view of semiconductor or integrated circuit device 33 having a dielectric tub 10 according to the present invention together with a device or active component region or area 31 where transistor or diode devices or the like are formed. Passive components such as inductors are formed over, on, or overlying region 10 to provide an integrated circuit device or structure having a lower capacitance or reduced coupling effect with region 30. Preferably, an isolation region 34 (e.g., a trench isolation) further separates regions 10 and 31.

Figure 5:
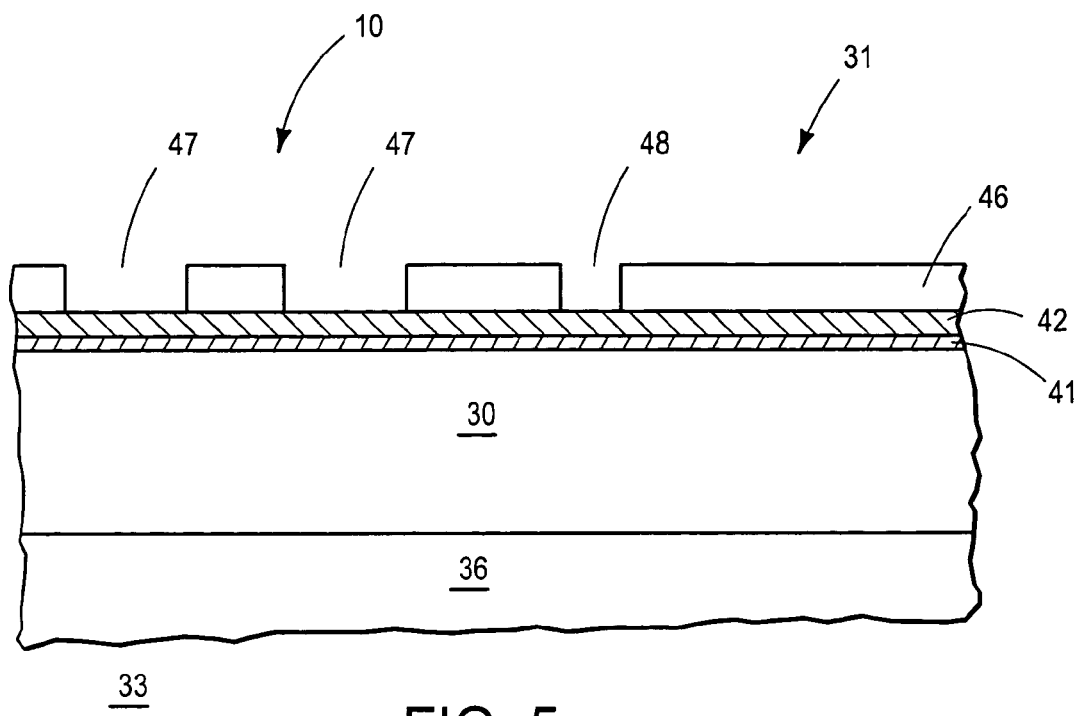
FIG. 5 illustrates a semiconductor device including a reduced capacitance region at an early stage of fabrication.

Turning now to FIGS. 5–9, a method or process flow is described for forming low capacitance region 10. As part of the embodiment described, trench isolation 34 and device region 31 also are described to show the integration of the present invention into an integrated circuit process flow. FIG. 5 shows a partial cross-sectional view of device 33 at an early stage of fabrication. For example, a first dielectric layer 41 is formed over a major surface of semiconductor region 30. By way of example, semiconductor region 30 comprises P-type silicon having a dopant concentration of about $1.25 \times 10^{16}$ atoms/cm$^3$. This dopant concentration is adjusted according to specific device specifications. Semiconductor region 30 comprises, for example, an epitaxial layer formed over a semiconductor substrate or region 36.

First dielectric layer 41 comprises, for example, a silicon oxide or the like, and has a thickness of about 500 angstroms. A second dielectric layer 42 is formed over first dielectric layer 41, and comprises, for example, a silicon nitride between about 500 and 1,500 angstroms thick. First dielectric layer 41 is formed using conventional thermal growth or deposition techniques, and second dielectric layer 42 is formed using conventional deposition techniques.

In an alternative embodiment, a polycrystalline semiconductor layer such as a polysilicon layer (not shown) is deposited between first and second dielectric layers 41 and 42. In a further embodiment, a third dielectric layer such as a deposited oxide (not shown) is formed over second dielectric layer 42. A photo-resist layer 46 is formed over second dielectric layer 42 and patterned to leave portions of second dielectric layer 42 exposed through openings 47 and 48. It is important that openings 47, which is used to form low capacitance region 10 (e.g., shapes 13) is wider than opening 48, which is used to provide trench isolation 34. The exposed portions of second dielectric layer 42 and first dielectric layer 41 are then etched using conventional techniques to expose portions of semiconductor region 30. Photo resist layer 46 is then removed.

Figure 6:
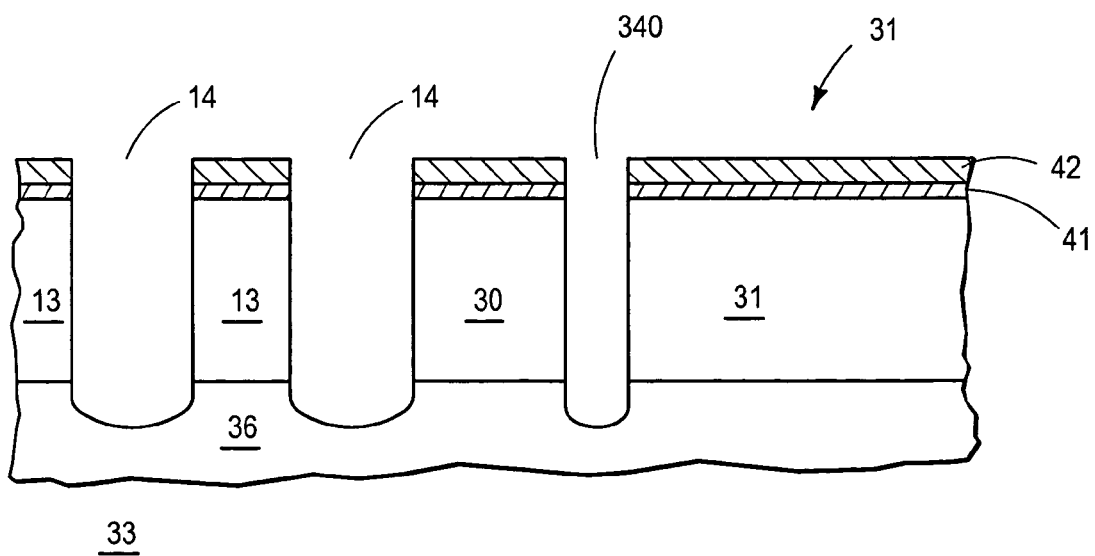
FIG. 6 illustrates the semiconductor device of FIG. 5 at a later stage of fabrication.

Next, an anisotropic dry etch step is used to form gaps 14 and trench 340 as shown in FIG. 6. A chlorine or fluorine based chemistry is used, for example, during this step. Gaps 14 and trench 340 are etched to a depth of about 6 microns to about 10 microns or deeper. Next, the sidewalls of gaps 14 and trench 34 are cleaned using, for example, a wet hydrofluoric acid etch and a dry $O_2$ etch.

Figure 7:
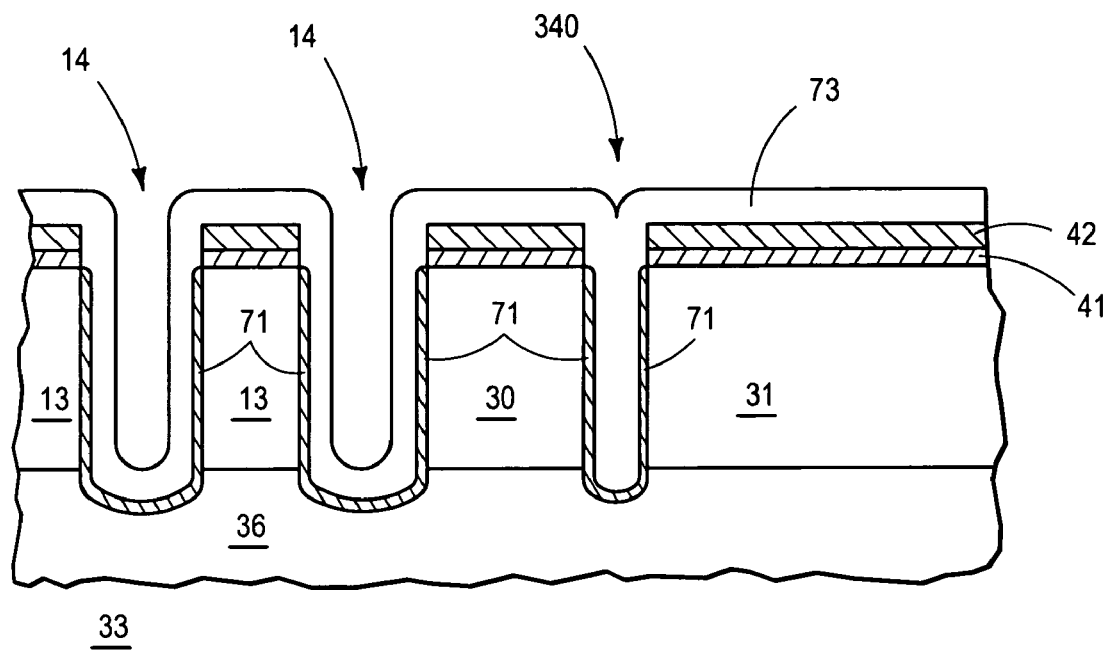
FIG. 7 illustrates the semiconductor device of FIG. 6 at a still later stage of fabrication.
Figure 8:
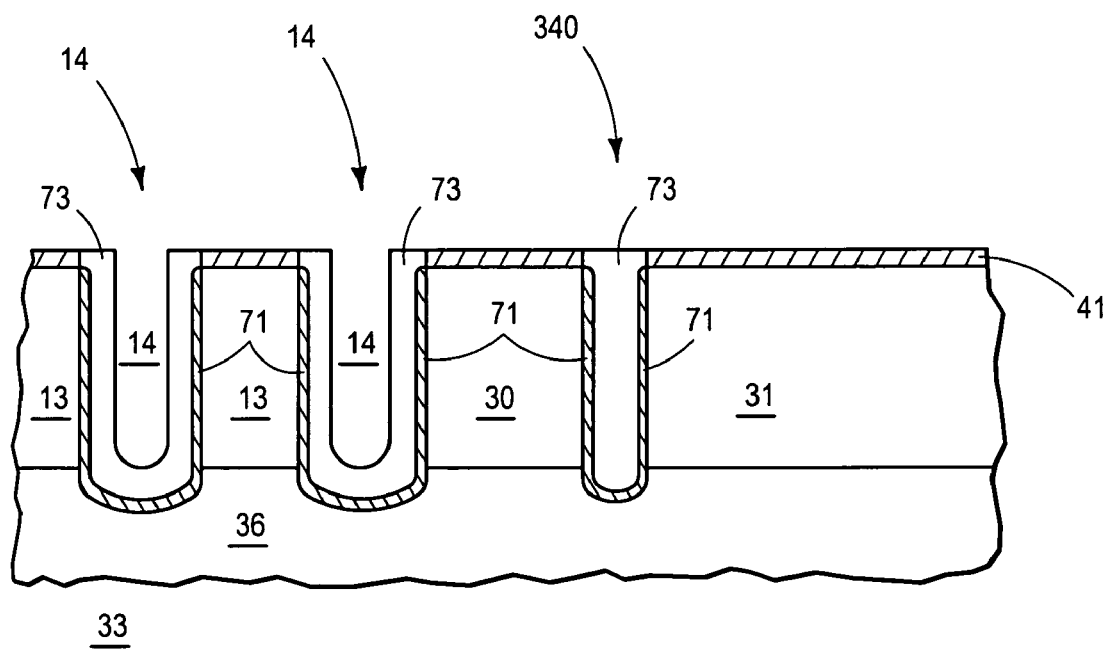
FIG. 8 illustrates the semiconductor device of FIG. 7 at a further stage of fabrication.

FIG. 7 shows device 33 at a subsequent step in fabrication. An optional dielectric layer 71 is formed on the sidewalls of gaps 14 and trench 340. In one embodiment, dielectric layer 71 comprises a thermal oxide having a thickness of 0 angstroms to about 1000 angstroms. Next an optional polycrystalline semiconductor layer 73 is formed over device 33. In one embodiment, polycrystalline layer 73 comprises a polysilicon layer having a thickness of 0 angstroms to about 5000 angstroms, sufficient to fill or over-fill the width of trench 340. Layer 73 is formed using atmospheric CVD or low-pressure CVD techniques.

Next, layer 73 is planarized using isotropic or anisotropic etch-back techniques to remove portions of layer 73. In one embodiment, second dielectric layer 42 is removed to provide structure 33 shown in FIG. 8. Because of the widths of openings 47, a portion of gaps 14 still exists after layer 73 is formed. These remaining portions of gaps 14 are important to provide exposure of shapes 13 to subsequent processing to form dielectric tub 10.

Figure 9:
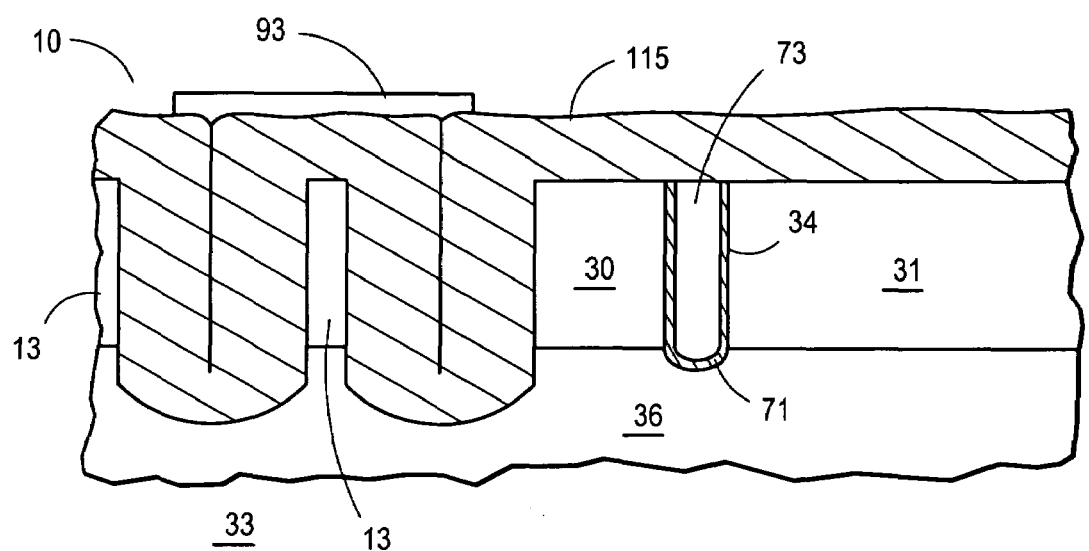
FIG. 9 illustrates the semiconductor device of FIG. 8 at a still further stage of fabrication.

Structure 33 including shapes 13 is then exposed to an ambient that includes a chemical species that reacts with the material of shapes 13 to form dielectric layer 115 as shown in FIG. 9. This forms low capacitance isolation region or tub 10. In one embodiment, structure 33 is exposed to a wet oxide ambient at 1,100 degrees Celsius to convert all or a substantial portion of shapes 13 to form a continuous or nearly continuous low stress silicon oxide region. In one embodiment, dielectric layer 115 comprises a silicon oxide having a thickness of about 5,000 angstroms to about 11,000 angstroms. During the formation of dielectric layer 115, those portions of layers 71 and 73 adjacent shapes 13 are converted to silicon oxide.

In subsequent processing steps, passive components 93 such as inductors, bonding pads, or the like are formed over dielectric layer 115. Likewise, active devices such transistors and diodes (not shown) are formed in active region 31. Dielectric region 10 provides for a reduced stress isolation between passive components 93 and region of semiconductor material 30 thereby improving the performance of semiconductor device 33.

As shown in the process flow of FIGS. 5–9, dielectric region 10 is easily integrated into an existing trench isolation flow without the addition of masking steps. Also, the initial structure of offset matrix 12 and perimeter 11 provide a final fully or nearly fully oxidized region that merges into a one, nearly continuous, low stress dielectric tub. The spaced relationship of shapes 13 further provides a depth independent, substantially void free, self-limiting and self-planarizing isolation structure, which overcomes the deficiencies of prior art structures and methods.

Capacitance data for a MIM capacitor formed over a dielectric region 10 for partially oxidized shapes 13 with a depth 23 of about 6 microns showed a 25% reduction in parasitic capacitance to substrate compared to a MIM capacitor formed over a conventional field oxide isolation. Additionally, the MIM capacitor formed over partially oxidized shapes 13 in a dielectric region 10 showed an 85% improvement in Q compared to the MIM capacitor formed over the conventional field oxide isolation. Further reductions in capacitance will result from increased sidewall oxidation.

Thus it is apparent that there has been provided, in accordance with the present invention, a structure and method for forming a low stress low capacitance isolation tub. The tub is easily integrated into semiconductor device flows to save on manufacturing costs. The low stress tub provides enhanced device performance and improved yields and reliability. By eliminating or reducing voids and air gaps, the structure and method of the present invention also reduces or eliminates any associated contamination problems.

Although the invention has been described and illustrated with reference to specific embodiments thereof, it is not intended that the invention be limited to these illustrative embodiments. For example, an additional deposition or planarization step or steps are used after the formation of dielectric layer 91 to fill any remaining voids or gaps in the dielectric or to provide a more planar major surface. Also, shapes within matrix 12 may be the same or combinations of different or slightly different shapes. Those skilled in the art will recognize that modifications and variations can be made without departing from the spirit of the invention. Therefore, it is intended that this invention encompass all such variations and modifications as fall within the scope of the appended claims.

I claim:

1. A process for forming an integrated circuit device including the steps of:
   removing a portion of material from a semiconductor layer to form a tub region having a lower surface while leaving another portion of material within the tub region to form a matrix of isolated shapes protruding from the lower surface, wherein the matrix of shapes comprises offset rows; and
   forming a dielectric region within the matrix of shapes.

2. The process of claim 1 wherein the step of removing includes removing a portion of material from the semiconductor layer to form the tub region having the lower surface while leaving another portion of material within the tub region to form a matrix of squares.

3. The process of claim 1 wherein the step of forming the dielectric region includes oxidizing the matrix of shapes.

4. The process of claim 3 wherein the step of oxidizing forms a nearly continuous silicon oxide tub.

5. The process of claim 1 further comprising the step of forming a passive component over the dielectric region.

6. The process of claim 1 further comprising the step of forming an isolation trench in another portion of semiconductor layer.

7. The process of claim 1 further comprising the steps of:
   forming a dielectric layer on sidewalls of the matrix of shapes; and
   forming a polycrystalline semiconductor layer over the dielectric layer.

8. The process of claim 1 wherein the step of removing includes removing a portion of material from the semiconductor layer to form the tub region having the lower surface while leaving another portion of material within the tub region to form the matrix of shapes protruding from the lower surface, wherein shapes in a first row have a first spacing, and wherein the shapes in the first row have a second spacing from shapes in a second row, and wherein the second spacing is less than the first spacing.

9. A semiconductor device comprising:
   a region of semiconductor material; and
   a dielectric tub formed in the region of semiconductor material, wherein the dielectric tub includes a matrix of passivated shapes protruding from a lower surface of the dielectric tub, and wherein at least some shapes are non-connected and are laterally surrounded by passivation material, and wherein adjacent rows of passivated shapes are offset.

10. The device of claim 9 wherein the dielectric tub comprises oxidized silicon shapes.

11. The device of claim 9 wherein the dielectric tub includes a boundary having a recessed portion.

* * * * *